United States Patent
Kawasaki et al.

(10) Patent No.: US 6,207,998 B1
(45) Date of Patent: Mar. 27, 2001

(54) SEMICONDUCTOR DEVICE WITH WELL OF DIFFERENT CONDUCTIVITY TYPES

(75) Inventors: Satoshi Kawasaki; Mikio Asakura; Kenji Tokami, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/329,290

(22) Filed: Jun. 10, 1999

(30) Foreign Application Priority Data

Jul. 23, 1998 (JP) .................................................. 10-208049

(51) Int. Cl.[7] .......................... H01L 29/76; H01L 29/94; H01L 31/062; H01L 31/113; H01L 31/119
(52) U.S. Cl. ........................... 257/371; 257/378; 257/532
(58) Field of Search ..................................... 438/223, 224, 438/227, 228; 257/296, 369, 371, 378, 532, FOR 371, FOR 378

(56) References Cited

U.S. PATENT DOCUMENTS

| | | | |
|---|---|---|---|
| 5,264,723 | * 11/1993 | Strauss ................................... | 257/532 |
| 5,361,234 | 11/1994 | Iwasa .................................... | 257/296 |
| 5,373,476 | * 12/1994 | Jeon ..................................... | 365/226 |
| 5,519,243 | 5/1996 | Kikuda et al. ......................... | 257/371 |
| 5,838,047 | * 11/1998 | Yamauchi et al. ..................... | 257/372 |
| 5,930,191 | * 7/1999 | Jeon ..................................... | 365/226 |
| 6,097,067 | * 8/2000 | Ouchi et al. ........................... | 257/369 |
| 6,104,070 | * 8/2000 | Matsumoto et al. ................... | 257/371 |

FOREIGN PATENT DOCUMENTS

| | | |
|---|---|---|
| 6-216332 | 8/1994 | (JP) . |
| 7-086430 | 3/1995 | (JP) . |
| 10-079484 | 3/1998 | (JP) . |

* cited by examiner

*Primary Examiner*—Olik Chaudhuri
*Assistant Examiner*—Hoai Pham
(74) *Attorney, Agent, or Firm*—McDermott, Will & Emery

(57) ABSTRACT

An MOS capacitor is provided in the proximity of the boundary between a P well and an N well formed of a bottom N well and an N well. Accordingly, the proximity of the boundary corresponding to the so-called dead space can be used effectively.

16 Claims, 13 Drawing Sheets

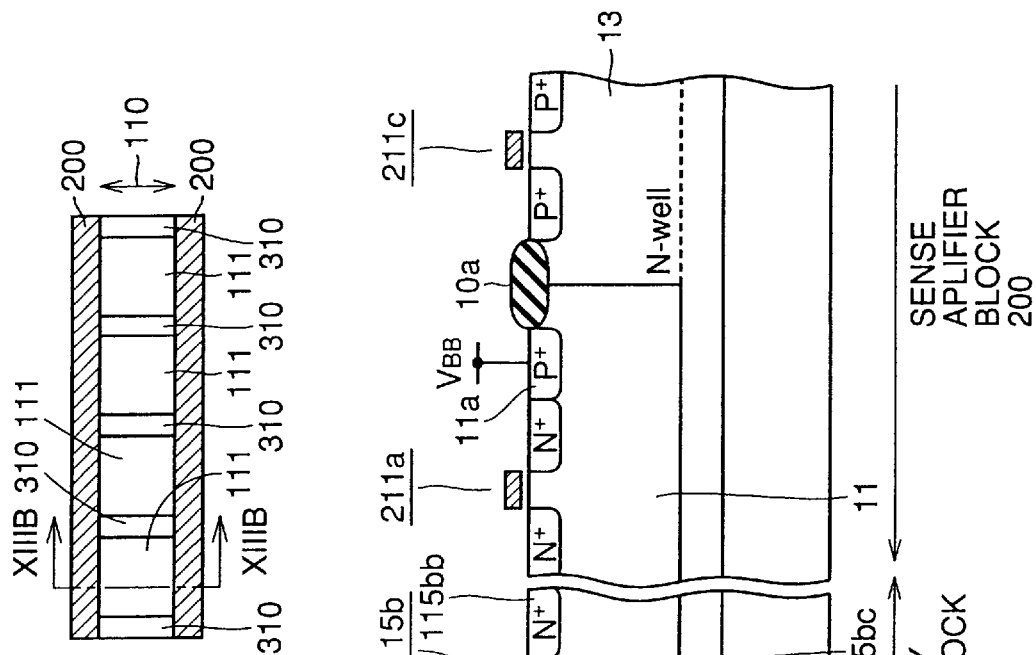
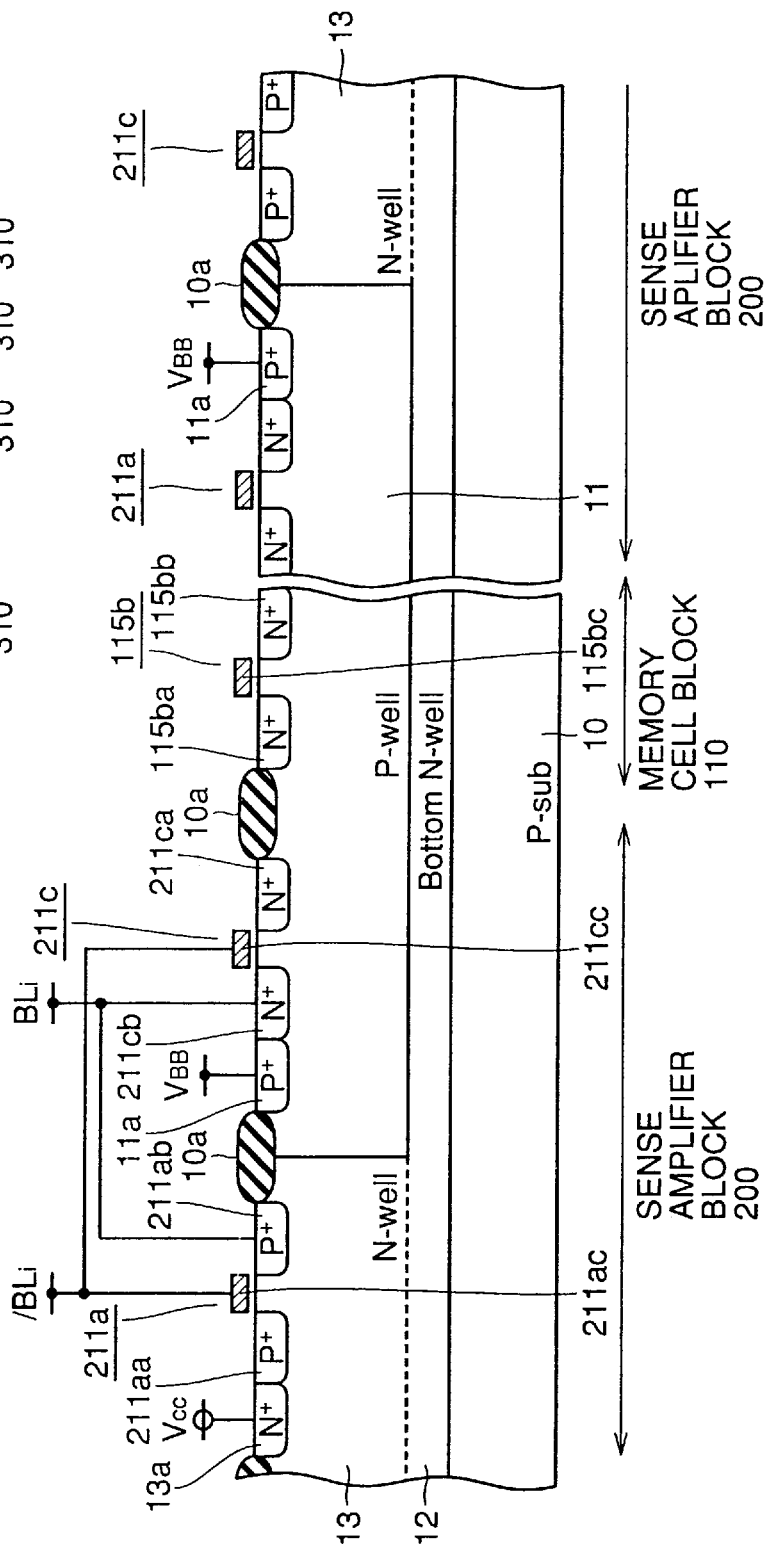
FIG.13A
FIG.13B

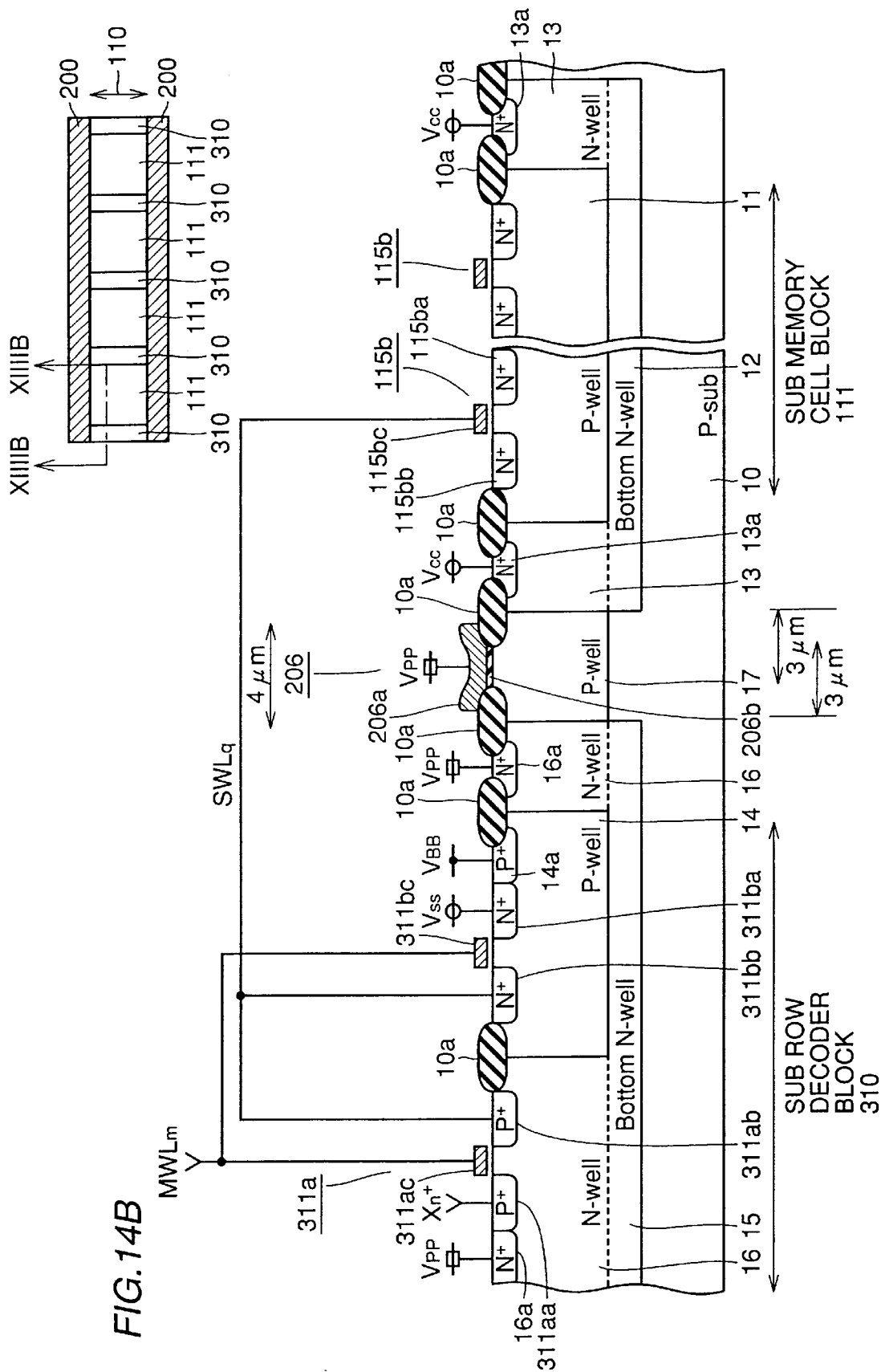

SEMICONDUCTOR DEVICE WITH WELL OF DIFFERENT CONDUCTIVITY TYPES

BACKGROUND OF THE INVENTION

1. Field of the Invention

The present invention relates to semiconductor devices, and more particularly, to a semiconductor device including wells of different conductivity types.

2. Description of the Background Art

Semiconductor devices having many transistors integrated are used in various electrical products such as workstations and personal computers.

A conventional DRAM employed as the main memory in a personal computer will be described hereinafter with reference to FIG. 15 showing a partial sectional view thereof.

Referring to FIG. 15, a DRAM includes a P type well 2, a P type well 3, and an N type well 4 formed on a P type silicon semiconductor substrate 1. The DRAM also includes an N type well 5 formed surrounding the sidewall of P well 2, and an N type bottom N well 6 formed below P well 2. The DRAM further includes an N channel MOS transistor 7 formed at P well 2, an N channel MOS transistor 8 formed at P well 3, and a P channel MOS transistor 9 formed at N well 4.

The formation of a bottom N well in a conventional DRAM will be described with reference to FIG. 16. In the conventional DRAM of FIG. 16, the area excluding the area where bottom N well 6 is to be formed is masked by a photo resist RE prior to formation of P wells 2 and 3 and N well 4. N type ions are implanted from above P type semiconductor substrate 1 to form bottom N well 6. The boundary between the portion where photo resist RE remains and the portion where photo resist RE is removed by an exposure•development step, i.e. the sidewall of photo resist RE, has a tapered configuration. Therefore, some of the N type ions will be introduced to the surface of the area where P well 3 is to be formed. If a transistor is formed at this area where N type ions are implanted, the transistor will not have the desired characteristics. Thus, a dead space was provided where no element is formed at the range within 4 μm from the boundary of bottom N well 6.

SUMMARY OF THE INVENTION

An object of the present invention is to effectively utilize the dead space in the proximity of the bottom N well.

Another object of the present invention is to reduce power supply noise using a capacitor formed at a dead space.

According to the present invention, a semiconductor device includes a first well of a first conductivity type, a second well of a second conductivity type with a bottom well at the bottom portion, formed surrounding and in contact with the side portion and the bottom portion of the first well, a third well of the first conductivity type in contact with the second well and adjacent to the first well with the second well therebetween, and an MOS capacitor located at a boundary region between the second and third wells. The MOS capacitor is located at a boundary region of the second and third wells. The MOS capacitor includes an electrode formed on the third well with an insulation film therebetween, and an impurity region formed at the surface of the third well, receiving a predetermined voltage.

An advantage of the present invention is that, since the capacitor is provided in the proximity of the boundary between the third well and the second well including the bottom well, the region in the proximity of this boundary can be used effectively.

The semiconductor device of the present invention further includes a memory cell with a memory transistor of the second conductivity type formed at the first well, a fourth well of the second conductivity type opposite the second well with the third well therebetween, and a peripheral circuit with a transistor of the first conductivity type formed at the fourth well.

A sense amplifier is provided at a peripheral circuit. The sense amplifier includes a transistor of the first conductivity type and a transistor of the second conductivity type formed at the first well. A power supply line providing a sense amplifier potential and the capacitor are connected. Accordingly, variation in the potential of the power supply line occurring when the sense amplifier is activated can be suppressed without increasing the layout area. A semiconductor device that carries out a stable sense operation can be obtained.

Particularly, the peripheral circuit includes a word line driver having a transistor of the first conductivity type formed at the second well and a transistor of the second conductivity type formed at the first well.

Particularly, the first conductivity type is the P type, and the second conductivity type is the N type. A power supply potential is applied to the fourth well. A boosted potential higher than the power supply potential is applied to the second well.

Particularly, the first, second and third wells are formed at the semiconductor substrate of the first conductivity type. A substrate potential is applied to the electrode of the first conductivity type formed at the third well.

According to the present invention, a semiconductor device includes a first well of a first conductivity type, a second well of a second conductivity type with a bottom well at the bottom portion, formed surrounding and in contact with the side portion and the bottom portion of the first well, a third well of the first conductivity type in contact with the second well and adjacent to the first well with the second well therebetween, an isolation insulator located at the boundary region between the second well and the third well, and an MOS capacitor. The MOS capacitor includes an electrode formed on the third well with an insulation film therebetween, and in contact with the isolation insulator, and an impurity region formed at the surface of the third well, receiving a predetermined voltage.

A further advantage of the present invention is that, since a capacitor is provided in the proximity of the boundary between the third well and the second well including the bottom well, the region in the proximity of the boundary can be used effectively, and that proper operation can be carried out by forming the MOS capacitor so that the electrode is in contact with the isolation insulator.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13A and 13B are views to describe the schematic cross section of a DRAM of a fourth embodiment taken along a column direction.

FIGS. 14A and 14B are views to describe the schematic cross section of a DRAM of the fourth embodiment taken along a row direction.

DESCRIPTION OF THE PREFERRED EMBODIMENTS

First Embodiment

A DRAM (dynamic random access memory) according to the first embodiment of the present invention will be described hereinafter.

Figure 1:
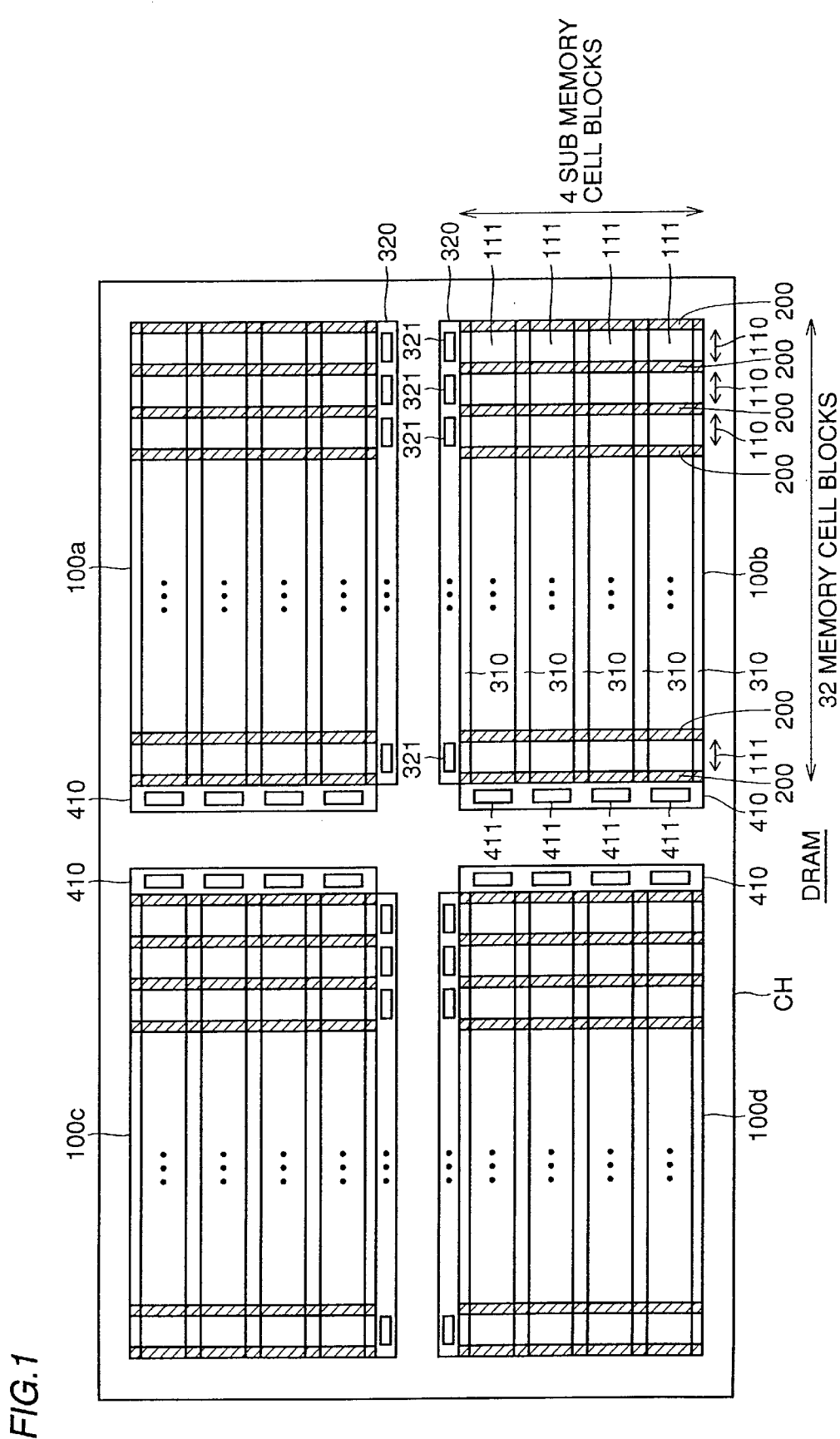
FIG. 1 is a schematic diagram of a DRAM chip according to a first embodiment of the present invention.

Referring FIG. 1, a DRAM is formed in a semiconductor chip CH. The DRAM includes a memory cell array with four sub memory cell arrays 100a, 100b, 100c and 100d. Each of sub memory cell arrays 100a, 100b, 100c and 100d includes a plurality (32 in the present embodiment) of memory cell blocks 110. Each memory cell block 110 includes a plurality (4 in the present embodiment) of sub memory cell blocks 111. The DRAM also includes a sense amplifier block 200 provided sandwiching memory cell block 110.

The DRAM also includes a sub row decoder block 310 provided sandwiching sub memory cell block 111. The DRAM includes a main row decoder block 320 provided corresponding to each of sub memory cell blocks 100a, 100b, 100c and 100d. Main row decoder block 320 includes a plurality of main row decoders 321 provided corresponding to memory cell blocks 110, respectively. The DRAM further includes a column decoder block 410 provided corresponding to each of memory cell arrays 100a, 100b, 100c and 100d. Column decoder block 410 includes a plurality of column decoders 411 provided corresponding to sub memory cell blocks 110, respectively. Sense amplifier block 200, sub row decoder blocks 310, main row decoder block 320 and column decoder block 410 are included in a peripheral circuit.

The correspondence between memory cell block 110 and the peripheral circuit will be described with reference to FIG. 2. Each sub memory cell block 111 includes a plurality (512 in the present embodiment) of bit line pairs 112. Each bit line pair 112 includes bit lines 112a and 112b. Sense amplifier block 200 includes an amplify/precharge/equalize circuit 210 to amplify the potential difference in bit line pairs 112, or to precharge/equalize potentials $BL_i$ and $/BL_i$ (i=0, 1, . . . ) of bit lines 112a and to the level of a bit line precharge potential $V_{BL}$. Precharge potential $V_{BL}$ is the intermediate potential $(1/2)(V_{CC}+V_{SS})$ between power supply potential $V_{CC}$ and ground potential $V_{SS}$. In the present embodiment, ground potential $V_{SS}$ is 0V, and power supply potential $V_{CC}$ is 1.5V, higher than ground potential $V_{SS}$. Power supply potential $V_{CC}$ and ground potential $V_{SS}$ are supplied as operating potentials to operate the DRAM.

Sense amplifier block 200 includes an isolation gate circuit 220. Isolation gate circuit 220 includes N channel MOS transistors 221 and 222 to isolate bit line pair 112 from amplify/precharge/equalize circuit 210 in response to a bit line isolation signal $BLI_j$ (j-0, 1, . . . ). Sense amplifier block 200 further includes a data bus 230. Data bus 230 includes a pair of data bus lines 231 and 232 to transmit the data from the memory cell array. Sense amplifier block 200 also includes a data transfer circuit 240. Data transfer circuit 240 selectively connects bit line pair 112 and data bus 230 according to a column select signal $CSL_k$ (k=0, 1, . . . ). Data transfer circuit 240 includes N channel MOS transistors 241 and 242.

The correspondence between sub memory cell block 111 and a peripheral circuit will be described with reference to FIG. 3. A main word line 113 is connected to main row decoder 321, common to a plurality (4 in the present embodiment) of sub memory cell block 111. A plurality of main word lines 113 (in the present embodiment, 64 main word lines) are provided corresponding to one memory cell block 110. Main row decoder 321 selects one of the 64 main word lines 113 in response to an address signal to render a main word signal $MWL_m$ (m=1, 2, . . . )applied to selected main word line 113 to a high level (logical high).

Each sub memory cell block 111 includes a plurality of sub word lines 114. Focusing on one sub memory cell block 111, four sub word lines 114 correspond to one main word line 113.

Sub row decoder block 310 includes a plurality of word line drivers 311 provided corresponding to sub word line 114 to apply a high potential $V_{PP}$ (in the present embodiment, 5V) to a corresponding sub word line 114 in response to main word signal $MWL_m$ transmitted through a corresponding main word line 113 and a row decode signal $X_n{}^+$(n=0, 1, 2, 3) (+indicates a high potential $V_{PP}$ higher than power supply potential $V_{CC}$) according to an address signal. A plurality of sub row decoders are provided corresponding to main word lines 113, respectively. A plurality (10 in the present embodiment) of word line drivers 311 corresponding to one main word line 113 are included in one sub row decoder.

Figure 2:
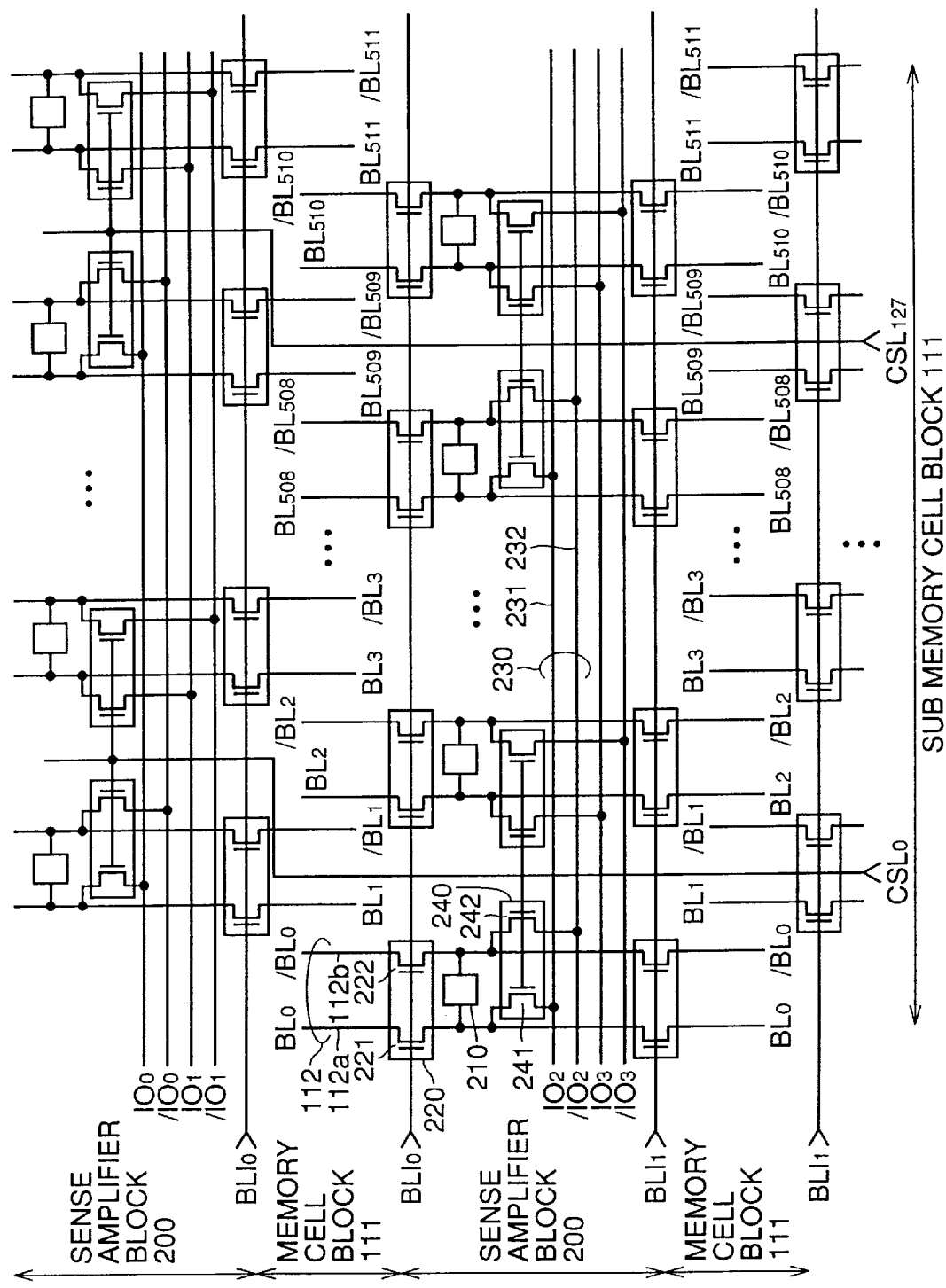
FIG. 2 is a simplified circuit diagram of a DRAM according to the first embodiment of the present invention.
Figure 3:
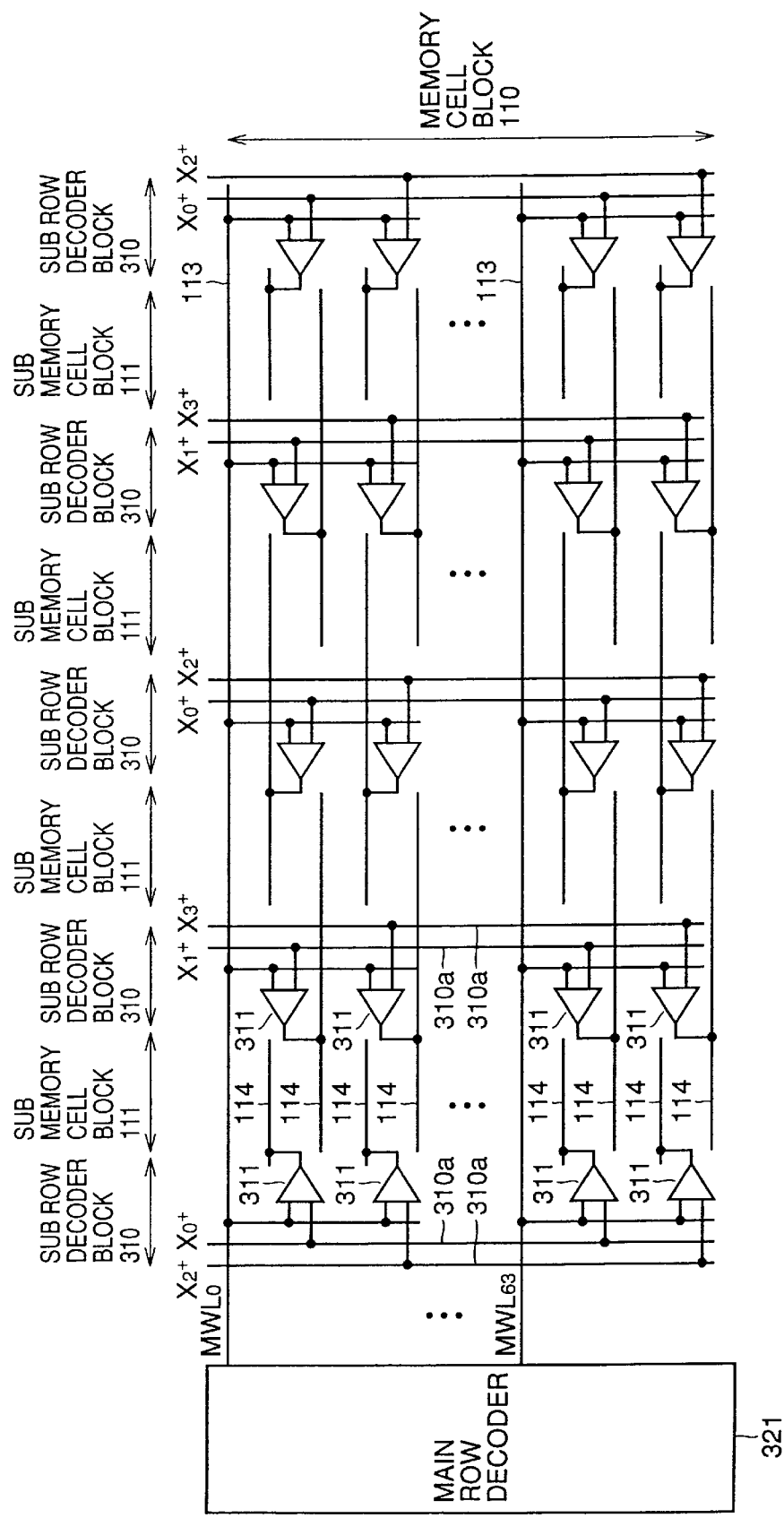
FIG. 3 is a simplified circuit diagram showing the correspondence between the main and sub row decoders of the first embodiment.
Figure 4:
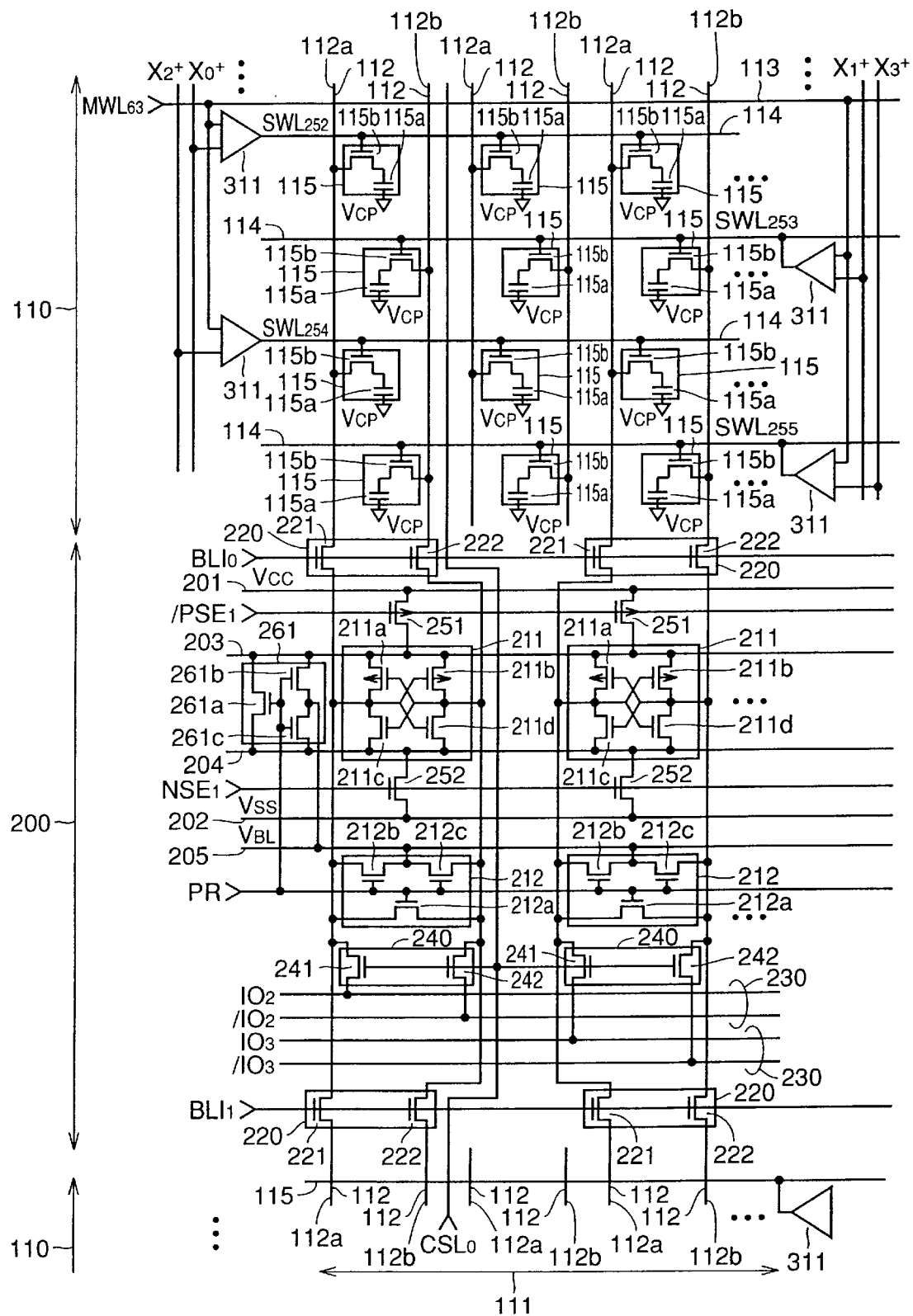
FIG. 4 is a circuit diagram showing a sub memory cell block and a peripheral circuit of the first embodiment.

FIG. 4 is a circuit diagram showing in detail a portion of sub memory cell block 111 and a peripheral circuit of FIGS. 2 and 3. Sub memory cell block 111 includes a plurality of memory cells 115 arranged in rows and columns. Each memory cell 115 includes a memory capacitor 115a receiving a cell plate potential $V_{CP}$ at one electrode, and a memory transistor 115b of an N channel MOS transistor connected between the other electrode of memory capacitor 115a and bit line 112a/112b, and having a gate connected to sub word line 114. Main word line 113 and sub word line 114 extend in the row direction. Bit line pair 112 is arranged in the column direction. Sub word line 114 is arranged corresponding to a row of memory cells 115. A plurality of memory cells 115 of a corresponding row are connected to sub word line 114. Bit line pair 112 is arranged corresponding to a column of memory cells, and connected to a plurality of memory cells 115 of a corresponding column.

The peripheral circuit includes a power supply line 201 through which power supply potential $V_{CC}$ is supplied, a power supply line 202 through which a ground potential $V_{SS}$ is supplied, a common source line 203, a common source line 204, and a precharge potential line 205 through which bit line precharge potential $V_{BL}$ is transmitted. The peripheral circuit also includes a P channel MOS transistor 251 charging common source line 203 to the level of power supply potential $V_{CC}$ according to a sense amplifier enable signal/$PSE_p$ (p=0, 1, 2, . . . ), and a N channel MOS transistor 252 discharging common source line 204 to the level of ground potential $V_{SS}$ according to a sense amplifier enable signal $NSE_p$.

The peripheral circuit further includes a sense amplifier 211 amplifying the potential difference of bit line pair 112 connected via a isolation gate circuit 220 to set the potential of one bit line to the level of power supply potential $V_{CC}$ and the potential of the other bit line to the level of ground potential $V_{SS}$. Sense amplifier 211 includes cross-coupled P channel MOS transistors 211a and 211b to amplify the higher potential of bit lines 112a and 112b to the level of power supply potential $V_{CC}$, and cross-coupled N channel MOS transistors 211c and 211d amplifying the lower potential of bit lines 112a and 112b to the level of the ground potential $V_{SS}$. Sense amplifier 211 receives power supply potential $V_{CC}$ and ground potential $V_{SS}$ as operating potentials from power supply lines 201 and 202 included in the operating potential lines.

The peripheral circuit further includes a bit line precharge/equalize circuit 212 to equalize/precharge the potentials of bit lines 112a and 112b according to precharge signal PR. Bit line precharge/equalize circuit 212 includes an N channel MOS transistor 212a to equalize the potentials of bit lines 112a and 112b according to precharge signal PR, and N channel MOS transistors 212b and 212c precharging the potentials of bit lines 112a and 112b to the level of bit line precharge potential $V_{BL}$ according to precharge signal PR. Sense amplifier 211 and bit line precharge/equalize circuit 212 are included in amplify/precharge/equalize circuit 212 shown in FIG. 2.

The peripheral circuit further includes a common source line precharge/equalize circuit 261 to equalize/precharge the potentials of common source lines 203 and 204 according to precharge signal PR. Common source line precharge/equalize circuit 261 includes an N channel MOS transistor 261a to equalize the potentials of common source lines 203 and 204 according to precharge signal PR, and N channel MOS transistors 261b and 261c to precharge the potentials of common source lines 203 and 204 to the level of bit line precharge potential $V_{BL}$ according to precharge signal PR.

Figure 5:
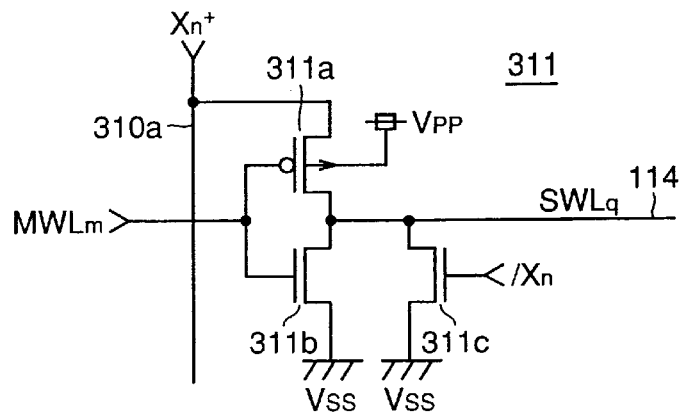
FIG. 5 is a circuit diagram of a word line driver of the first embodiment.

Word line driver 311 will be specifically described with reference to the circuit diagram of FIG. 5. Word line driver 311 includes a P channel MOS transistor 31 1a connected between a row decode signal line 310a and sub word line 214, receiving a potential $MWL_m$ of main word line 213 at its gate, and a high potential $V_{PP}$ at its back gate. Word line driver 311 also includes an N channel MOS transistor 311b connected between sub word line 114 and a ground node to which ground potential $V_{SS}$ is applied, receiving potential $MWL_m$ of main word line 113 at its gate. Word line driver 311 further includes an N channel MOS transistor 311c connected between sub word line 114 and the ground node, receiving an inverted signal/$X_n$ (having an amplitude of $V_{CC}$-$V_{SS}$, not the amplitude of $V_{PP}$-$V_{SS}$ as for row decode signal $X_n^+$) of row decode signal $X_n^+$ at its gate.

Figure 6:
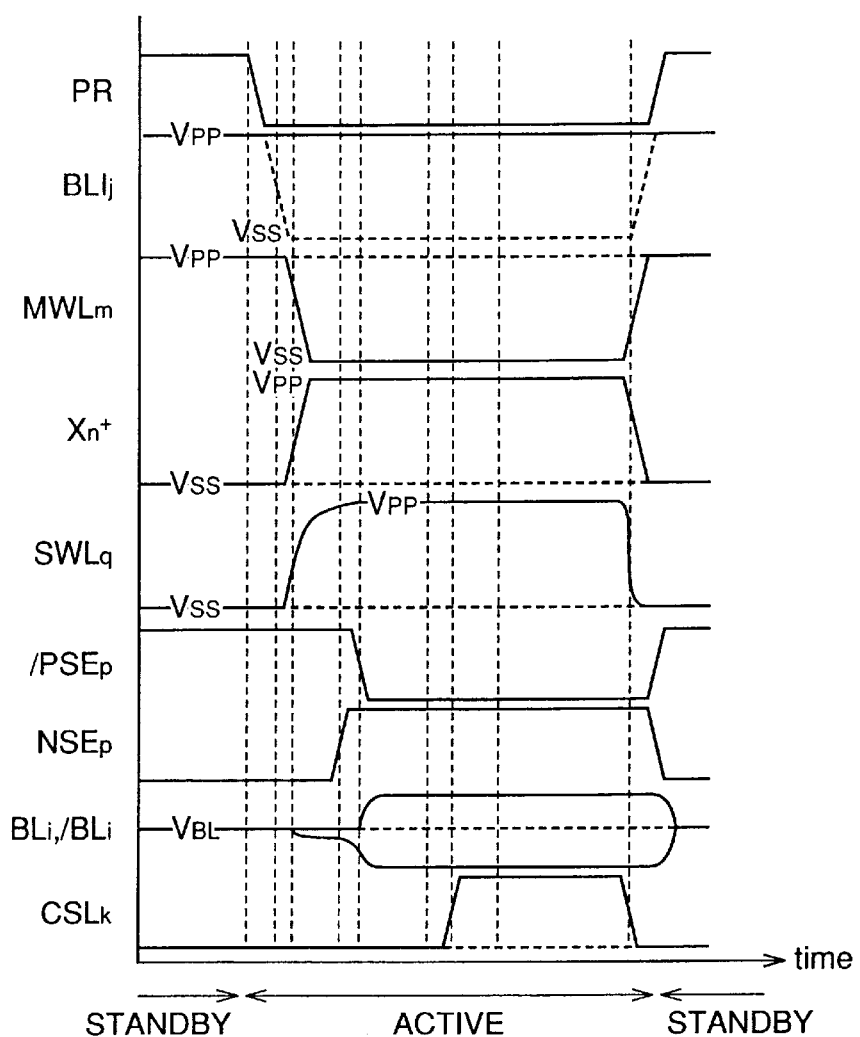
FIG. 6 is a timing chart showing an access operation of the DRAM of the first embodiment.

A read/write operation of the DRAM will be described with reference to the timing chart of FIG. 6. When the DRAM is at a standby state, main row decoder 321 sets all main word lines 113 at the level of high potential $V_{PP}$. All row decode signals $X_0^+$-$X_3^+$ are set at a low level (logical low). Inverted row decode signals /$X_0$-/$X_3$ are set at a high level. Therefore, transistor 311c of FIG. 5 conducts, whereby all sub word lines 114 are at the level of ground potential $V_{SS}$. Memory transistor 115b in memory cell 115 receiving the potential of sub word line 114 is rendered nonconductive, so that the data in memory cell 115 is retained.

In the standby state, all bit line isolation signals $BLI_j$ are at the level of boosted potential $V_{PP}$. All bit line pairs 112 are connected to corresponding sense amplifier 211 and bit line precharge/equalize circuit 212. Precharge signal PR is at a high level. In response, bit line precharge/equalize circuit 212 precharges and equalizes potentials $BL_i$ and /$BL_i$ of bit lines 112a and 112b to the level of bit line precharge potential $V_{BL}$. Common source line precharge/equalize circuit 261 responds to precharge signal PR of a high level to precharge and equalize the potentials of common source lines 203 and 204 to the level of precharge potential $V_{BL}$.

In the standby state, sense amplifier enable signal /$PSE_p$ is at a high level and signal /$NSC_p$ is at a low level. Therefore, P channel MOS transistor 251 and N channel MOS transistor 252 are at a nonconductive state. Accordingly, the potentials of common source lines 203 and 204 are both at the level of bit line precharge potential $V_{BL}$. Therefore, all the sense amplifiers 211 are rendered inactive. All column select signals $CSL_k$ are at a low level. Therefore, N channel MOS transistors 241 and 242 of data transfer circuit 240 receiving column select signal $CSL_k$ of a low level are both nonconductive. Therefore, bit line pair 112 is isolated from data bus 230.

Upon an access request (read/write operation) to the DRAM, the DRAM is rendered active. Precharge signal PR is pulled down to a low level. In response, bit line precharge/equalize circuit 212 ceases the precharge and equalize operation of bit lines 112a and 112b. Also, common source line precharge/equalize circuit 261 ceases the precharge and equalize operation of common source lines 203 and 204. Bit line isolation signal $BLI_j$ corresponding to memory cell block 110 selected by an address signal is maintained at the level of boosted potential $V_{PP}$. Bit line isolation signal $BLI_j$ corresponding to a non-selected memory cell block 110 is pulled down to a low level. In response, bit line pair 112 of non-selected memory cell block 110 is isolated from sense amplifier 211 and bit line precharge/equalize circuit 212 by isolation gate circuit 220.

One memory cell block 110 is selected from each of sub memory cell arrays 100a, 100b, 100c, and 100d according to an address signal. One main word line 113 is selected from each selected memory block 110. The level of potential $MWL_m$ of selected main word line 113 in selected memory cell block 110 is driven from the level of high potential $V_{PP}$ to ground potential $V_{SS}$ by main row decoder 321. Also, row decode signal $X_n^+$ selected by the address signal is driven to the level of high potential $V_{PP}$. In word line driver 311 having both the two inputs of main word signal $MWL_m$ and row decode signal $X_n^+$ selected, N channel MOS transistors 311b and 311c are rendered nonconductive, and P channel MOS transistor 311a is rendered conductive. Potential $SWL_q$ of selected sub word line 114 is driven to the level of high potential $V_{PP}$.

Memory transistor 115b in the plurality of memory cells 115 connected to selected sub word line 114 is rendered conductive, whereby charge is transferred between the other electrode of capacitor 115a and bit line 112a/112b. Accordingly, potentials $BL_i$ and $/BL_i$ of bit lines 112a and 112b slightly rise or fall (FIG. 6 corresponding to the case where data of low level is stored) than precharge potential $V_{BL}$ according to the data of a high level or low level stored in capacitor 112a.

When sense amplifier enable signal $NSE_p$ corresponding to selected memory cell block 110 attains a high level, N channel MOS transistor 252 is rendered conductive. The potential of common source line 204 falls towards the level of ground potential $V_{SS}$. As a result, the N channel sense amplifier of N channel MOS transistors 211c and 211d of sense amplifier 211 reduces the low potential $BL_i$ or $/BL_i$ of bit line 112a or 112b that is slightly lower towards the level of ground potential $V_{SS}$.

When sense amplifier enable signal/$PSE_p$ corresponding to selected memory cell block 110 attains a low level, P channel MOS transistor 251 receiving this signal is rendered conductive. As a result, the potential of common source line 203 rises towards to the level of power supply potential $V_{CC}$. The P channel sense amplifier of P channel MOS transistors 211a and 211b in sense amplifier 211 raises the higher potential $Bli_i$ or $/Bli_i$ of bit lines 112a and 112b towards the level of power supply potential $V_{CC}$.

After the slight potential difference in bit line pair 112 is amplified by sense amplifier 212, column select signal $CSL_k$ selected according to an address signal (one column select signal $CSL_k$ is selected in each column in sub memory block 111) attains a high level. Bit line pair 112 corresponding to column select signal $CSL_k$ of a high level is selectively connected to a corresponding data bus 230 by data transfer circuit 240. The potential difference in bit line pair 112 amplified by sense amplifier 211 is transmitted to data bus 230. In a read out operation, the potential difference of data bus 230 is amplified and read out as read data. In a write operation, a potential difference corresponding to the write data is applied to data bus 230. A potential corresponding to the write data is applied via bit line 112a or 112b to selected memory cell 115.

When the read/write operation ends, potential $SWL_q$ of sub word line 114 is driven to a low level, bit line isolation signal $BLI_j$ to the $V_{PP}$ level, column select signal $CSL_k$ to the low level, sense amplifier enable signal/$PSE_p$ to a high level, sense amplifier enable signal $NSE_p$ to a low level, and precharge signal PR to a high level. By bit line precharge/equalize circuit 212 receiving precharge signal PR of a high level, potentials $BL_i$ and $/BL_i$ of bit line pair 112 are precharged and equalized to the level of bit line precharge potentials $V_{BL}$. Also, by common source line precharge/equalize circuit 261 receiving precharge signal PR of a high level, the potentials of common source lines 203 and 204 are precharged and equalized to the level of bit line precharge potential $V_{BL}$. Thus, the DRAM returns to the standby state.

Figure 7:
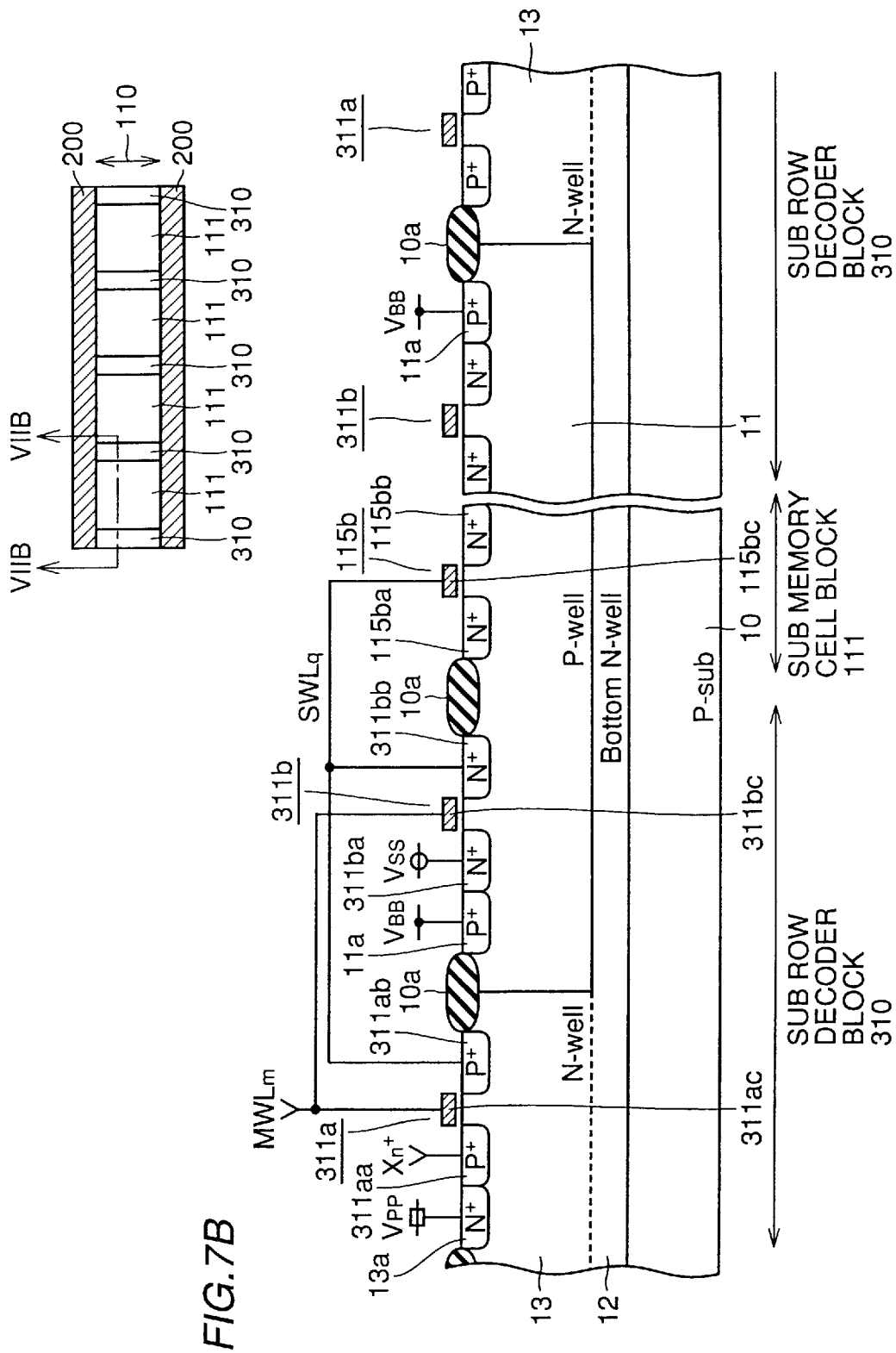
FIGS. 7A and 7B are schematic sectional views of the DRAM of the first embodiment taken along a row direction.

FIG. 7A is a top view of the proximity of sub memory cell block 111 and sub row decoder block 310. FIG. 7B is a sectional view taken along the row direction of FIG. 7A. Referring to FIGS. 7A and 7B, the DRAM includes a P type well 11 formed on a P type semiconductor substrate 10. A bottom N well 12 is formed on semiconductor substrate 10 in contact with the bottom of P well 11. An N well 13 is formed on semiconductor substrate 10 and in contact with the side portion of P well 11. Bottom N well 12 and N well 13 are electrically conductive, and is formed as an integral N well to isolate P well 11 from semiconductor substrate 10. In P well 11, an electrode 11a is provided. Electrode 11a is formed of a P type diffusion region to apply a back bias potential $V_{BP}$ lower than the ground potential to P well 11. In N well 13, an electrode 13a is provided. Electrode 13a is formed of an N type diffusion region to apply high potential $V_{PP}$ to bottom N well 12 and N well 13. P well 11, bottom N well 12 and N well 13 form the so-called triple well structure. An isolation insulator 10a is formed between each element.

Memory transistor 115b of memory cell 115 is formed at P well 11. Memory transistor 115b includes source/drain regions 115ba and 115bb formed of N diffusion regions. Memory transistor 115b also includes a gate 115bc provided opposite the region of P well 11 sandwiched between source/drain regions 115ba and 115bb with a gate insulation film thereunder. An N channel MOS transistor 311b of word line driver 311 is formed at P well 11 where memory transistor 115b is provided. N channel MOS transistor 311b includes a source 311ba of an N diffusion region receiving ground potential $V_{SS}$, and a drain 311bb of an N type diffusion region to apply a sub word signal $SWL_q$. Drain 311bb is connected to gate 115bc of memory transistor 115b. N channel MOS transistor 311b includes a gate 311bc provided opposite the region of well 11 sandwiched between source 311ba and drain 311bb with a gate insulation film thereunder. Gate 311bc receives main word signal $MWL_m$.

P channel MOS transistor 311a of word line driver 311 is formed at N well 13. P channel MOS transistor 311a includes a source 311aa of a P type diffusion region receiving row decode signal $X_n^+$, and a drain 311ab of a P diffusion region, connected to drain 311bb of N channel MOS transistor 311b. P channel MOS transistor 311a includes a gate 311ac provided opposite the region of N well 13 sandwiched between source 311aa and drain 311ab with a gate insulation film thereunder. Gate 311ac receives main word signal $MWL_m$. Although not illustrated in FIGS. 7A and 7B, N channel MOS transistor 311c of word line driver 311 is formed at P well 11 similar to N channel MOS transistor 311b.

According to the DRAM of the first embodiment, N channel MOS transistors 311b and 311c forming word line driver 311 are both formed at P well 11 where memory transistor 115b is formed. With the potential of the N well formed of bottom N channel 12 and N channel 13 surrounding P well 11 as high potential $V_{pp}$ identical to the back bias of P channel MOS transistor 311a of word line driver 311, the N well forming P channel MOS transistor 311a does not have to be provided in addition to the N well surrounding P well 11. Therefore, bottom N well 12 is provided along the row direction, common to sub memory cell block 111 and sub row decoder block 310. There is no disconnection between sub memory cell blocks 111.

Figure 8:
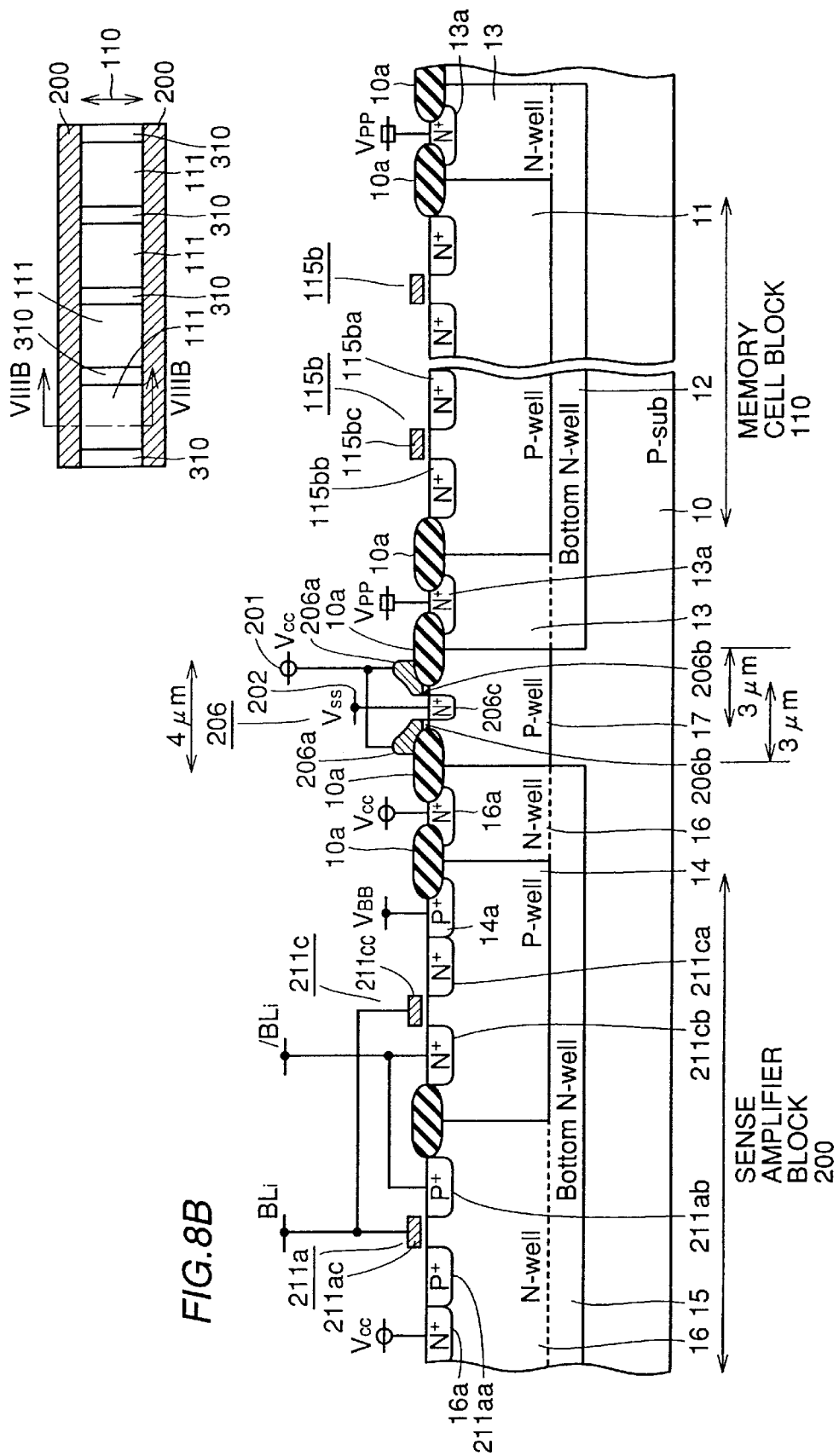
FIGS. 8A and 8B are schematic sectional views of the DRAM of the first embodiment taken along a column direction.

FIG. 8A is a top view for describing the proximity of the boundary between memory cell block 110 and sense amplifier block 200. FIG. 8B is a sectional view of FIG. 8A taken along the column direction. Referring to FIGS. 8A and 8B, the DRAM includes, in addition to P well 11, bottom N well 12 and N well 13 described with reference to FIGS. 7A and 7B, a P type well 14 formed on semiconductor substrate 10. An N type bottom well 15 is formed in contact with the bottom of P well 14 on semiconductor substrate 10. An N well 16 is formed in contact to the side of P well 14 on semiconductor substrate 10. Also, a P well 17 is formed on semiconductor substrate 10, in contact with N well 13 and adjacent to P well 11 with N well 13 therebetween. Bottom N wells 12 and 15 are the first to be formed in these wells, followed by formation of N wells 13 and 16. Then, P wells 11, 14 and 17 are formed.

Bottom N well 15 and N well 16 electrically conduct, and form an integral N well to isolate P well 14 from semiconductor substrate 10. At P well 14, an electrode 14a is provided. Electrode 14a is formed of a P type diffusion region to apply a back bias potential $V_{BP}$ lower than the ground potential to P well 14. In N well 16, an electrode 16a is provided. Electrode 16a is formed of an N diffusion region to apply power supply potential $V_{CC}$ to bottom N well 15 and N well 16. P well 14, bottom N well 15 and N well 16 form the so-called triple well structure.

Figure 16:
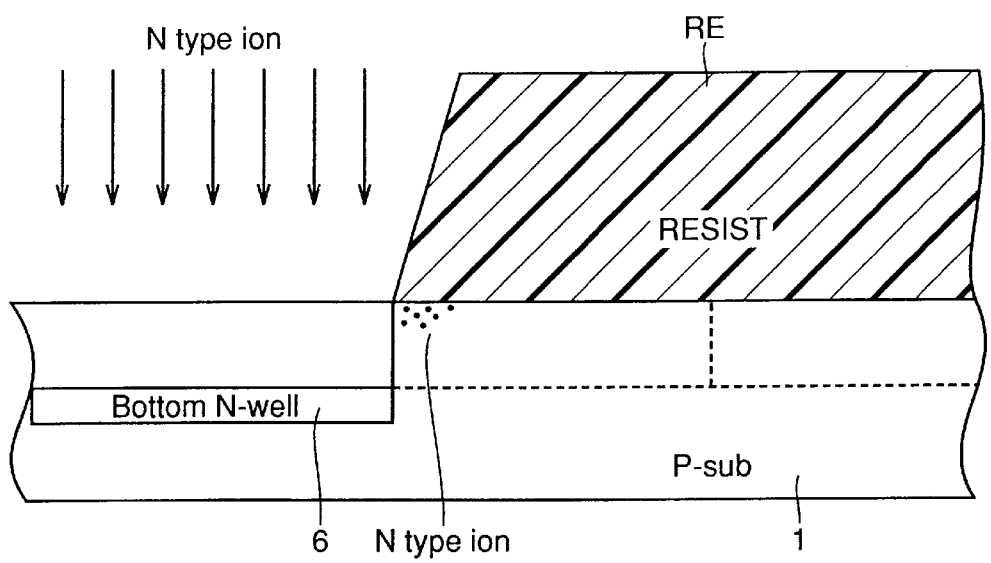
FIG. 16 is a sectional view showing a manner of a bottom N well formation in a conventional DRAM.

P well 17 is formed in contact with N well 16, and adjacent to P well 14 with N well 16 therebetween. The N well formed of bottom N well 12 and N well 13 and the N well formed of bottom N well 15 and N well 16 have different potentials applied. Therefore, these N wells are spaced apart from each other by 4 μm to prevent shorting therebetween. In other words, P well 17 has a width of 4 μm. Similar to the description with reference to FIG. 16, the region where P well 17 is to be formed is masked with a photo resist. N type ions are implanted from above to form bottom N wells 12 and 15. Since the photo resist is tapered, N type ions are implanted in the proximity of the top surface of P well 17. It is conventional to avoid forming a transistor at P well 17 since the threshold value of the transistor formed at P well 17 may be varied by the process steps.

In the present DRAM, an MOS capacitor 206 is formed at P well 17 where no transistor is formed to effectively use the dead space. The N type ions implanted in the proximity of the top surface of P well 17 are not so great as to cancel the P type polarity of P well 17. Therefore, the function as an MOS capacitor can be exhibited sufficiently even if the threshold value is varied. MOS capacitor 206 includes an electrode 206c (N type diffusion region) formed at the surface of P well 17, and an electrode 206a formed opposite to the top surface of P well 17 with a gate insulation film 206b therebetween.

Figure 12A:
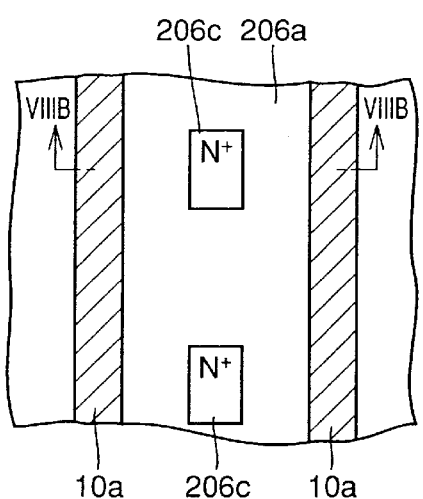
FIGS. 12A and 12B are top views in the neighborhood of MOS capacitor 206 of the first embodiment.
Figure 12B:
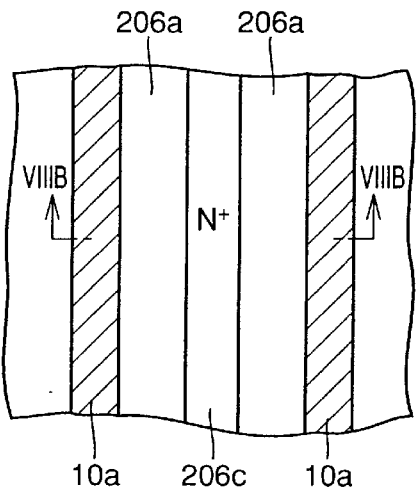
Figure 15:
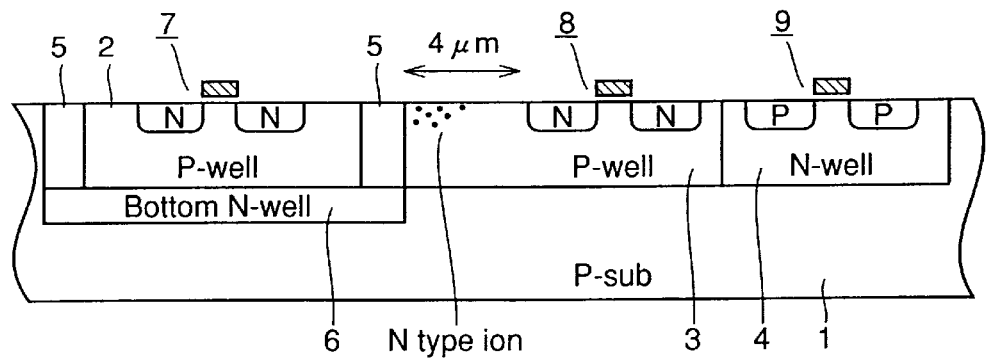
FIG. 15 is a schematic sectional view of a conventional DRAM.

Electrode 206c included in MOS capacitor 206 is formed in P well 17, located substantially at the center of electrode 206a. The structure of electrode 206c viewed from above can be arranged, localized in the neighborhood of the contact hole with ground potential $V_{SS}$, spaced apart applied appropriately as shown in FIG. 12A, or arranged in a continuous manner along the extending direction of MOS capacitor 206 as shown in FIG. 12B.

In FIG. 8B, electrode 206a is connected to a power supply line 201 supplying power supply potential $V_{CC}$ to sense amplifier 211. A high voltage $V_{PP}$ can be applied to electrode 206a. Electrode 206c is connected to power supply line 202 supplying ground potential $V_{SS}$ to sense amplifier 211.

MOS capacitor 206 is located within 3 μm from the boundary between P well 17 and the N well formed of bottom N well 12 and N well 13. MOS capacitor 206 is also located within 3 μm from the boundary between P well 17 and the N well formed of bottom N well 15 and N well 16. Location within 3 μm means that at least a portion of the region opposite electrode 206a of MOS capacitor 206 with insulation film 206b of P well 17 therebetween is within the region of 3 μm. Electrode 206a is in contact with isolation insulator 10a located at the boundary between N well 13 and P well 17. Electrode 206a is also in contact with isolation insulator 10a located at the boundary between N well 16 and P well 17. MOS capacitor 206 is located within 3 μm from the boundary of bottom N wells 12 and 15.

N channel MOS transistor 211c of sense amplifier 211 is formed at P well 14. N channel MOS transistor 211c includes a source 211ca formed of an N type diffusion region, and a drain 211cb formed of an N type diffusion region. Drain 211cb receives potential $BL_i$ of bit line 112b. Source 211ca is located closer to capacitor 206 than drain 211cb. N channel MOS transistor 211c includes a gate 211cc provided opposite the region sandwiched by source 211ca and drain 211cb of P well 14 with a gate insulation film thereunder. Gate 211cc receives potential /$BL_i$ of bit line 112a.

P channel MOS transistor 211a of sense amplifier 211 is formed at N well 16. P channel MOS transistor 211a includes a source 211aa formed of a P type diffusion region, and a drain 211ab formed of a P type diffusion region, and connected to drain 211cb of N channel MOS transistor 211c. P channel MOS transistor 211a includes a gate 211ac provided opposite the region sandwiched by source 211aa and drain 21 1ab of N well 16 with a gate insulation film thereunder. Gate 211ac is connected to gate 211cc of N channel MOS transistor 211c.

Although not shown in FIG. 8B, N channel MOS transistor 252, N channel MOS transistors 221 and 222 in isolation gate circuit 220, N channel MOS transistor 211d of sense amplifier 211, N channel MOS transistors 212a, 212b, 212c of bit line precharge/equalize circuit 212, and N channel MOS transistors 241, 242 in data transfer circuit 240 are formed at P well 14 where N channel MOS transistor 211c is provided. P channel MOS transistor 251 and P channel MOS transistor 211b of sense amplifier 211 are formed at N well 16 where P channel MOS transistor 211a is provided.

In the DRAM of the first embodiment, MOS capacitor 206 is formed at P well 17 where no transistor is formed to take advantage of the dead space. One electrode 206c of MOS capacitor 206 formed at the surface of P well 17 is connected to power supply line 202 supplying ground potential $V_{SS}$ to sense amplifier 211. The other electrode 206a is connected to power supply line 201 supplying power supply potential $V_{CC}$ to sense amplifier 211. Therefore, the noise (rise from 0V) of power supply line 202 generated when sense amplifier 211 is rendered active and attenuation of the potential of power supply line 201 can be suppressed without increasing the layout area. A semiconductor device that can carry out a sense operation stably can be obtained.

An epitaxial substrate of low resistance is preferably used for semiconductor substrate 10. By virtue of the substrate of low resistance, the substrate potential is firmly fixed at ground potential $V_{SS}$. The variation in the substrate potential is small. Therefore, variation generated at the substrate and which is conveyed via MOS capacitor 206 to power supply line 202 through which ground potential $V_{SS}$ is applied to sense amplifier 211 can be reduced.

Variation in the characteristics is of no concern in this case as long as an MOS capacitor is used. Shorting between the $V_{PP}$ voltage and the ground potential can be prevented by placing the N+S/D electrode (connected to ground potential) apart by at least 2.0 μm from the bottom N well (connected to $V_{PP}$ voltage (internal generated high voltage), operating power supply voltage of the sense amplifier, and the like) without shorting between the channel and the bottom N well.

Second Embodiment

A DRAM according to a second embodiment of the present invention will be described hereinafter with reference to FIG. 9. The DRAM of the second embodiment differs from the DRAM of the first embodiment in the well structure of sense amplifier block 200. More specifically, referring to the sectional view of the boundary between memory cell block 110 and sense amplifier block 200 taken along the column direction in FIG. 9, the DRAM of the second embodiment has N channel MOS transistor 211c in sense amplifier 211 formed at P well 11 where MOS transistor 115b is formed. Therefore, neither P well 14 nor bottom N well 15 is formed. N well 16 and P well 17 form the so-called twin well region.

The potential applied to the N well formed of bottom N well 12 and N well 13 and to N well 16 differs. Therefore, these wells are spaced apart from each other by a distance of 3.5 μm to prevent shorting. In other words, P well 17 has a width of 3.5 μm. Similar to the DRAM of FIG. 8B, MOS capacitor 206 is formed at P well 17 where no transistor is formed, taking advantage of the dead space. MOS capacitor 206 is located within 3 μm from the boundary between P well 17 and the N well formed of bottom N well 12 and N well 13. Electrode 206a is in contact with isolation insulator 10a located at the boundary between N well 13 and P well 17. MOS capacitor 206 is located within 3 μm from the boundary of bottom N well 12. Source 211ca of N channel MOS transistor 211c is located closer to MOS capacitor 206 than drain 211cb. Electrode 206a receives power supply potential $V_{CC}$ or high potential $V_{PP}$. Electrode 206c receives ground potential $V_{SS}$.

Figure 9:
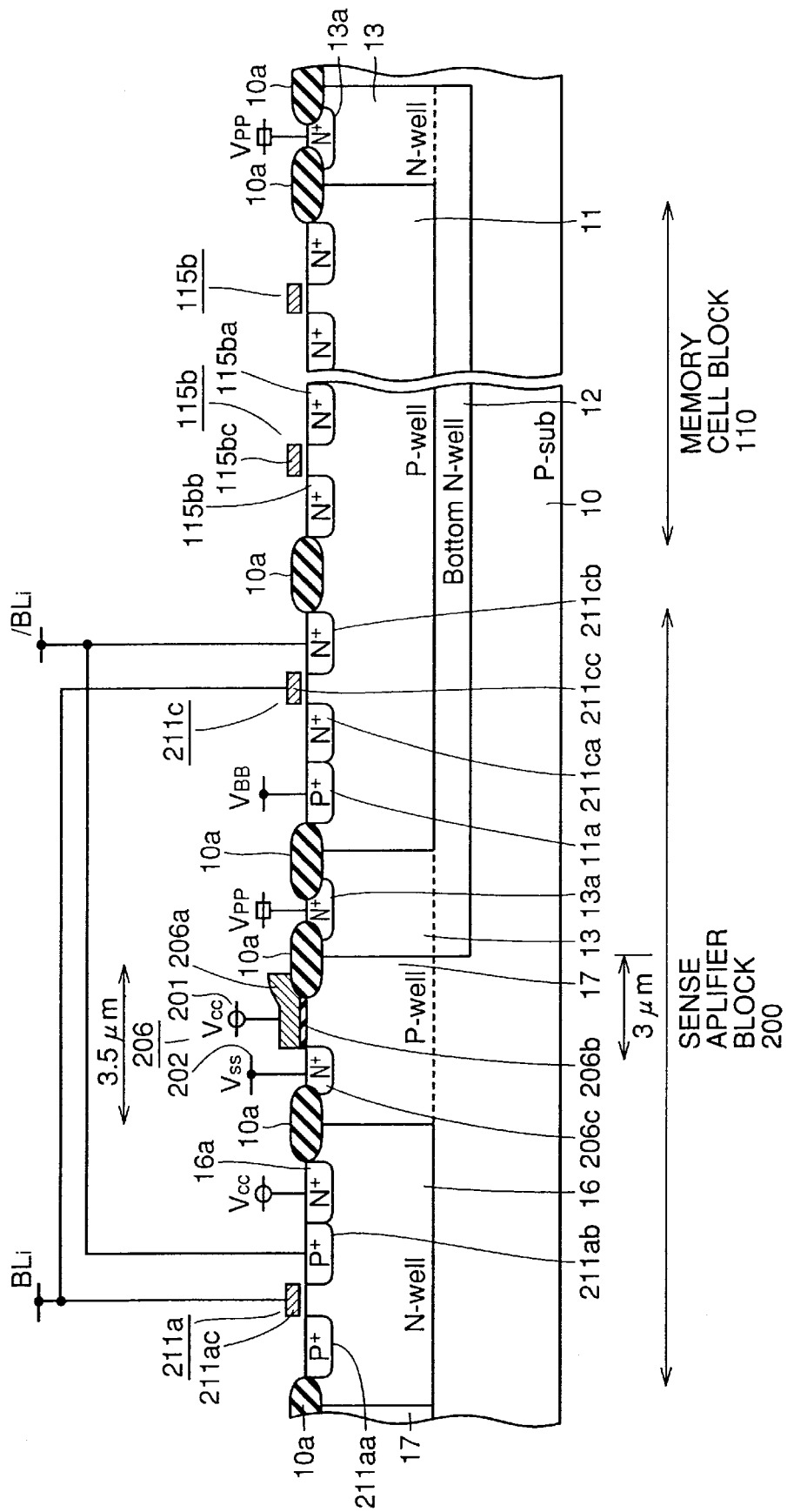
FIG. 9 is a schematic sectional view of a DRAM according to a second embodiment of the present invention taken along a column direction.

Although not illustrated in FIG. 9, N channel MOS transistor 252, N channel MOS transistors 221, 222 in isolation gate circuit 220, N channel MOS transistor 211d of sense amplifier 211, N channel MOS transistors 212a, 212b, 212c of bit line precharge/equalize circuit 212, and N channel MOS transistors 241, 242 in data transfer circuit 240 are formed at P well 11 where N channel MOS transistor 211c is provided. Also, P channel MOS transistor 251 and P channel MOS transistor 211b of sense amplifier 211 are formed at N well 16 where P channel MOS transistor 211a is provided.

In the DRAM of the second embodiment, the dead space can be used effectively by forming MOS capacitor 206 at P well 17 where no transistor is formed, as in the DRAM of the first embodiment. By connecting one electrode 206c of MOS capacitor 206 formed at the surface of P well 17 with power supply line 202 supplying ground potential $V_{SS}$ to sense amplifier 211 and by connecting the other electrode 206a with power supply line 201 supplying power supply potential $V_{CC}$ to sense amplifier 211, the noise (rise from 0V) of power supply line 202 generated when sense amplifier 211 is rendered active and attenuation of the potential of power supply line 201 can be suppressed. A semiconductor device that can carry out a sense operation stably is obtained.

N channel MOS transistor 211c included in sense amplifier 211 is formed at P well 11 where memory cell transistor 115b is formed, and N well 16 where P channel MOS transistor 211a is formed has a twin-well structure. Therefore, the distance between the bottom N well and the twin N well can be reduced to 3.5 μm in contrast to the distance of 5 μm between the bottom N wells. There are two reasons for this reduction. The first is that the film of the photo resist in implanting ions into the bottom N well must be made thicker than the photo resist used in implanting ions into N well 16. The second reasons is that N type impurities will be introduced in the shallow area at the boundary between the area introduced and the area not introduced in the bottom N well caused by the tapered configuration of the photo resist edge, whereby the insulation of the potential of the bottom N well and electrode 206c of the capacitor is easily destroyed. A channel is generated below gate 206a to become N-. However, since N type impurities are not introduced up to this shallow region (the surface of the well below 206a) in the bottom N well implantation step, insulation can be maintained. However, impurities are erroneously implanted to the shallow region sufficient for breakage of the insulation between the electrode and the bottom N well by the S/D implantation.

Figure 10A:
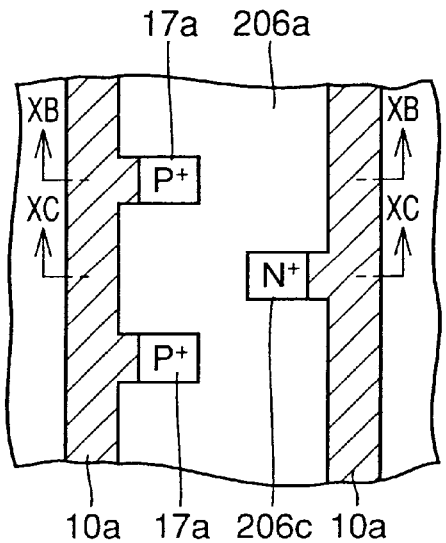
FIG. 10A is a top view and FIGS. 10B and 10C are sectional views in the neighborhood of an MOS capacitor of the second embodiment.
Figure 10B:
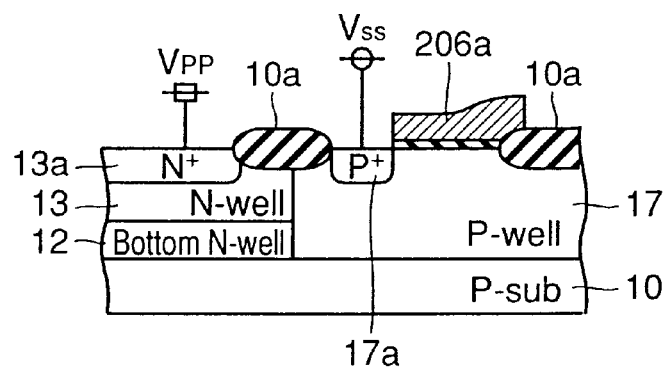
Figure 10C:
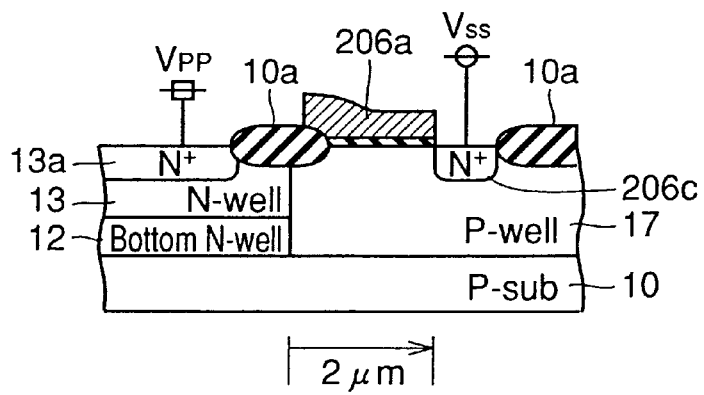

FIGS. 10A–10C show another example of MOS capacitor 206 according to the second embodiment of the present invention. FIG. 10A is a top view of MOS capacitor 206. FIGS. 10B and 10C are sectional views taken along plane XB—XB and plane XC—XC, respectively, of FIG. 10A. Referring to FIGS. 10A–10C, an electrode 17a of a P type diffusion region is provided to apply a substrate potential (in the present embodiment, ground potential $V_{SS}$) to P well 17. Also, another electrode 206c of an N type diffusion region of MOS capacitor 206 is provided at P well 17. In order to suppress leakage current with the N well formed of bottom N well 12 and N well 13, electrode 206c included in MOS capacitor 206 is provided away from this N well by at least 2 μm. Ground potential $V_{SS}$ is applied to electrode 206c. Substrate potential is applied to electrode 17a. This substrate potential is applied to semiconductor substrate 10 via P well 17. Electrode 206a includes an opening above electrodes 17a and 206c to apply potential to electrodes 17a and 206c.

Third Embodiment

Figure 11:
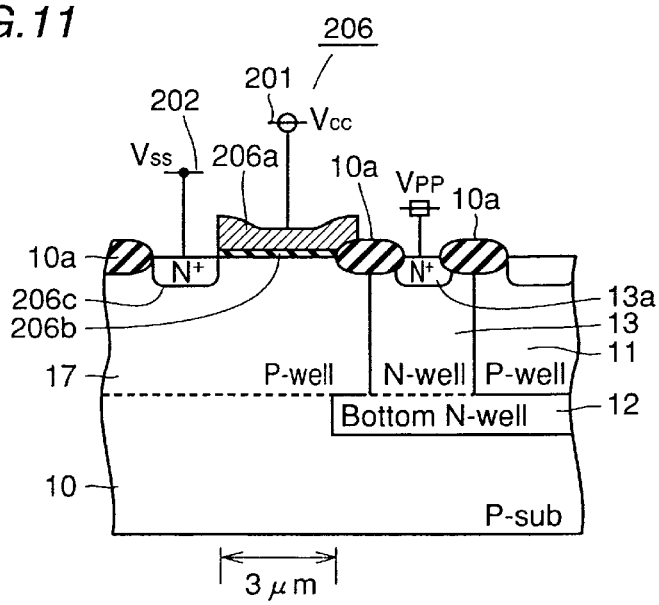
FIG. 11 is a schematic sectional view of a DRAM according to a third embodiment of the present invention taken along a column direction.

A DRAM according to a third embodiment of the present invention will be described hereinafter with reference to FIG. 11. The DRAM of the third embodiment differs from the DRAMs of the first and second embodiments in the structure of the N well formed of bottom N well 12 and N well 13. This difference will be described hereinafter with reference to the sectional view at the boundary of this N well and P well 17 taken along the column direction in FIG. 11. The DRAM of the third embodiment differs from the DRAM shown in FIGS. 8 and 10 in that N well 13 surrounding P well 11 is reduced in size in the inward direction. Also, the portion of electrode 206a of MOS capacitor 206 and P channel 17 sandwiching insulation film 106b extends up to the boundary of bottom N well 12.

In the third embodiment, MOS capacitor 206 is located within 3 μm from the boundary between P well 17 and the N well formed of bottom N well 12 and N channel 13. MOS capacitor 206 is located within 3 μm from the boundary of N well 13. MOS capacitor 206 is also located within 3 μm from the boundary of bottom N well 12. Particularly in the third embodiment, MOS capacitor 206 is located at 0 μm from the boundary of bottom N well 12. Similar to the first and second embodiments, electrode 206a is in contact with isolation insulator 10a located at the boundary between N well 13 and P well 17. Electrode 206a receives power supply potential $V_{CC}$ or high potential $V_{PP}$. Electrode 206c receives ground potential $V_{SS}$.

Since the boundary between N well 13 and P well 17 is shifted inwards of N well 13 in the DRAM of the third embodiment, the tolerance in the photo mask offset (margin in mask offset) during the fabrication process of bottom N well 12 and N well 13 can be increased in addition to the advantage of allowing a larger capacitance of MOS capacitor 206 with a large area for MOS capacitor 206. In other words, the problem of shorting between P well 11 and P type semiconductor substrate 10 caused by a gap between bottom N well 12 and N well 13 due to photo mask offset can be eliminated. The advantages of the first and second embodiments can also be enjoyed in the third embodiment.

Fourth Embodiment

A DRAM according to another embodiment of the present invention will be described hereinafter with reference to FIGS. 13A and 13B and FIGS. 14A and 14B. In the first to third embodiments of the present invention, boosted potential $V_{PP}$ is supplied to N well 13 where P channel MOS transistor 311a of word line driver 311 is formed. Therefore, there is no disconnection in bottom N well 12 along the row direction. There is no dead space in the row direction in contrast to the column direction where there was a dead space. A similar approach can be considered in the present fourth embodiment to eliminate disconnection in bottom N well 12 along the column direction by applying power supply potential $V_{CC}$ instead of boosted potential $V_{PP}$ to N well 13, where the P channel MOS transistor of sense amplifier block 200 is formed, as shown in FIGS. 13A and 13B.

In this case, P channel MOS transistor 311a in word line driver 311 must be formed at another N well to which high potential $V_{PP}$ is supplied. This means that disconnection is generated in bottom N well 12 in the row direction, as shown in FIGS. 14A and 14B. Although the dead space along the column direction encountered in the first to third embodiments is absent, there will be a dead space along the row direction instead in the fourth embodiment. This dead space can be effectively used by providing MOS capacitor 206 therein.

In the previous first to third embodiments, boosted potential $V_{PP}$ is applied to bottom N well 12 and N well 13. These bottom N well 12 and N well 13 surround P well 11 where memory cell block 110 is provided. Since the area occupied by memory cell block 110 is great in semiconductor chip CH as shown in FIG. 1, the area occupied by P well 11 is also great. Therefore, the capacitance between P well 11 and N wells 12 and 13 is great. Boosted potential $V_{PP}$ is applied to this capacitance, whereby this boosted potential $V_{PP}$ is stabilized. In the present fourth embodiment, power supply potential $V_{CC}$ is applied instead of boosted potential $V_{PP}$ to bottom N well 12 and N well 13. Therefore, the capacitance corresponding to boosted potential $V_{PP}$ becomes smaller. Boosted potential $V_{PP}$ is applied to electrode 206a of capacitor 206 in the fourth embodiment for compensation thereof.

Although electrode 206a of MOS capacitor 206 is connected to power supply line 201 in the first to third embodiments, the electrode can be connected to boosted potential $V_{PP}$ as in the fourth embodiment instead of to power supply line 201 when stabilization of boosted potential $V_{PP}$ is to be given more priority than the stabilization of power supply line 201. Conversely, the electrode can be connected to power supply line 201 when stabilization of power supply line 201 is more important instead of boosted potential $V_{PP}$ applied to electrode 206a of MOS capacitor 206.

Since gate insulation film 206b of MOS capacitor 206 of the first to fourth embodiments is formed at the same time of the gate insulation film of memory transistor 115b, the application of boosted potential $V_{PP}$ is within the breakdown potential range of gate insulation film 206b. If MOS capacitor 206 has a structure identical to that of memory capacitor 115a of memory cell 115, there is the possibility of the dielectric film of the capacitor being damaged when boosted potential $V_{PP}$ is applied since only the application of a potential up to $V_{CC}/2$ is expected to memory capacitor 115a.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a first well of a first conductivity type;
   a second well of a second conductivity type, surrounding and in contact with a side portion and a bottom portion of said first well, and including a bottom well provided at a bottom region;
   a third well of the first conductivity type formed in contact with said second well, and adjacent to said first well with said second well therebetween; and
   an MOS capacitor located at a boundary region between said second well and said third well, including an electrode formed on said third well with an insulation film therebetween, and an impurity region formed at a surface of said third well, receiving a predetermined voltage.

2. The semiconductor device according to claim 1, wherein said impurity region forming said MOS capacitor is located within 3 μm from the boundary between said second well and said third well.

3. The semiconductor device according to claim 1, further comprising:
   a memory cell including a memory transistor of the second conductivity type formed at said first well;
   a fourth well of the second conductivity type opposite to said second well sandwiching said third well; and
   a peripheral circuit including a transistor of the first conductivity type formed at said fourth well.

4. The semiconductor device according to claim 3, wherein said peripheral circuit comprises a sense amplifier including said transistor of the first conductivity type and a transistor of the second conductivity type formed at said first well.

5. The semiconductor device according to claim 3, wherein said peripheral circuit comprises a word line driver including a transistor of the first conductivity type formed at said second well and a transistor of the second conductivity type formed at said first well.

6. The semiconductor device according to claim 3, wherein said first conductivity type is a P type and said second conductivity type is an N type,
   wherein a power supply potential is applied to said fourth well, and a boosted potential higher than said power supply potential is applied to said second well.

7. The semiconductor device according to claim 1, further comprising:
   a sense amplifier; and
   an operating potential line supplying an operating potential to said sense amplifier,
   said MOS capacitor being connected to said operating potential line.

8. The semiconductor device according to claim 1, wherein said first, second and third wells are formed at a semiconductor substrate of the first conductivity type, and a substrate potential is applied to an electrode of the first conductivity type formed at said third well.

9. The semiconductor device according to claim 1, wherein said impurity region forming said MOS capacitor is located within a range of 2 μm–3 μm from the boundary between said second well and said third well.

10. A semiconductor device comprising:

a first well of a first conductivity type;

a second well of a second conductivity type, surrounding and in contact with a side portion and a bottom portion of said first well, and including a bottom well provided at a bottom region;

a third well of the first conductivity type formed in contact with said second well, and adjacent to said first well with said second well therebetween;

an isolation insulator located at the boundary region between the second well and the third well, and an MOS capacitor including an electrode formed on said third well with an insulation film therebetween, and in contact with said isolation insulator, and an impurity region formed at a surface of said third well, receiving a predetermined voltage.

11. The semiconductor device according to claim 10, further comprising:

a memory cell including a memory transistor of the second conductivity type formed at said first well;

a fourth well of the second conductivity type opposite to said second well sandwiching said third well; and a peripheral circuit including a transistor of the first conductivity type formed at said fourth well.

12. The semiconductor device according to claim 11, wherein said peripheral circuit comprises a sense amplifier including said transistor of the first conductivity type and a transistor of the second conductivity type formed at said first well.

13. The semiconductor device according to claim 11, wherein said peripheral circuit comprises a word line driver including a transistor of the first conductivity type formed at said second well and a transistor of the second conductivity type formed at said first well.

14. The semiconductor device according to claim 11, wherein said first conductivity type is a P type and said second conductivity type is an N type, wherein a power supply potential is applied to said fourth well, and a boosted potential higher than said power supply potential is applied to said second well.

15. The semiconductor device according to claim 10, further comprising:

a sense amplifier; and an operating potential line supplying an operating potential to said sense amplifier, said MOS capacitor being connected to said operating potential line.

16. The semiconductor device according to claim 10, wherein said first, second and third wells are formed at a semiconductor substrate of the first conductivity type, and a substrate potential is applied to an electrode of the first conductivity type formed at said third well.

* * * * *